United States Patent [19]

Miyagi

[11] 4,102,568
[45] Jul. 25, 1978

[54] APPARATUS FOR INDICATING MOUNTING POSITIONS OF COMPONENTS

[75] Inventor: Kiyoshi Miyagi, Yokohama, Japan

[73] Assignee: Matsushita Electric Industrial Co., Ltd., Osaka, Japan

[21] Appl. No.: 641,184

[22] Filed: Dec. 16, 1975

[30] Foreign Application Priority Data

Dec. 18, 1974 [JP] Japan .................. 49/145932

[51] Int. Cl.$^2$ .................. G03B 21/28; H01R 43/00
[52] U.S. Cl. .................. 353/28; 353/122; 29/720; 29/739; 29/626; 29/407
[58] Field of Search .................. 353/98, 121, 122, 28; 356/165; 350/121; 29/626, 203 B, 407, 720, 721, 739, 741

[56] References Cited

U.S. PATENT DOCUMENTS

| 2,682,117 | 6/1954 | Wales | 353/122 |
| 2,906,016 | 9/1959 | Cannon et al. | 29/407 |
| 2,917,834 | 12/1959 | Butler et al. | 353/121 |
| 3,112,354 | 11/1963 | Urias et al. | 356/165 |
| 3,323,415 | 6/1967 | Tobias | 353/28 |
| 3,377,915 | 4/1968 | Buckett | 353/122 |
| 3,469,909 | 9/1969 | Amoh | 353/98 |
| 3,548,493 | 12/1970 | Hubbard | 29/203 B |
| 3,564,692 | 2/1971 | Knoll et al. | 29/203 B |
| 3,667,104 | 6/1972 | Chamillard | 29/203 B |
| 3,710,477 | 1/1973 | Frawley | 29/203 B |

FOREIGN PATENT DOCUMENTS

| 1,219,167 | 1/1971 | United Kingdom | 350/121 |
| 1,235,340 | 6/1971 | United Kingdom | 353/28 |

Primary Examiner—Harry N. Haroian
Attorney, Agent, or Firm—Stevens, Davis, Miller & Mosher

[57] ABSTRACT

An apparatus for indicating mounting positions of components on a printed base which is designed so that the operation of mounting components can be performed accurately and easily even in cases where a wide variety of components are to be mounted on a printed base.

4 Claims, 9 Drawing Figures

FIG. 5
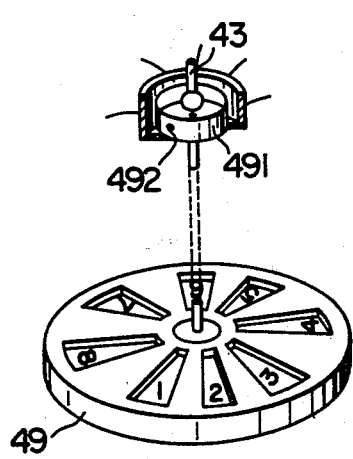
FIG. 6
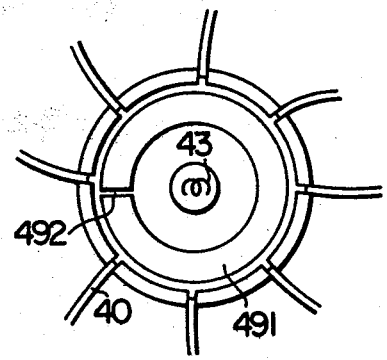
FIG. 7  FIG. 8  FIG. 9
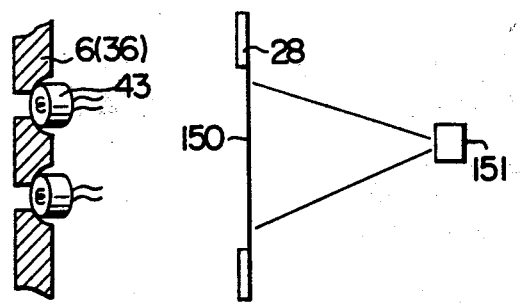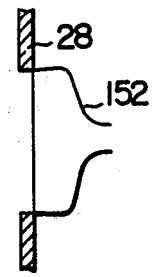

APPARATUS FOR INDICATING MOUNTING POSITIONS OF COMPONENTS

The present invention relates to an apparatus for indicating the mounting positions of components on a printed base which is so designed that where various components such as transistors, diodes, resistors and capacitors are to be mounted and wired on a printed base, the required wiring operation can be performed accurately and easily even if a wide variety of such components are to be mounted and wired.

In a known type of apparatus for indicating mounting positions of components on a printed base, light spots are projected on a mounting printed base to indicate small areas at which component are to be mounted and at the same time the component box containing the components to be mounted is indicated in synchronism with the light spots.

In this case, the indication by light is accomplished by either of the following two methods: (A) A projector is mounted at a position above a printed base to project the light spots on the printed base. (B) An electric lamp or a combination of an electric lamp and a photoconductive cell is used to illuminate the component mounting holes in a printed base from the back side thereof and form the indicating light spots.

A disadvantage of the former method (A) is that since no light shielding object should exist between the light spot forming areas of the printed base and the projection lens, where it is necessary to form the light spots on the inner parts of the printed base, the components mounted on the front part of the printed base cast shadows thus making it impossible to provide good light spot indications. On the other hand, even if the light spots have been formed on a printed base 101 by using a projector 102 as shown in FIG. 1 of the accompanying drawings, it is difficult for an operator 103 to discriminate the light spots since his eye is positioned outside the space defined between the projector 102 and the printed base 101. On the other hand, if the face of the operator 103 is brought between the printed base 101 and the projector 102 in consideration of such difficulty, the light spots formed on the front part of the printed base 101 will be caused to disappear. Consequently, where a plurality of components of the same grade are to be mounted, it is necessary to take the trouble of indicating only a single mounting position at a time.

Depending on the type of material used for the printed base (particularly in the case of epoxy-glass type material), the transparency of the printed base becomes so high that it is difficult to use the printed base in an illuminated room unless the indicating light quantity is increased considerably and there are cases where it is desirable to subject the surface of the printed base to some processing or treatment.

The method (B) is disadvantageous in that it is difficult to distinguish the indication unless the hole for receiving the pin of a component is viewed from a position which is in alignment therewith.

It is therefore the object of the invention to provide a novel apparatus for indicating mounting positions of components which eliminates the foregoing difficulty.

In accordance with the present invention, there is thus provided an apparatus for indicating mounting positions of components comprising a half mirror provided over a printed base on which components, e.g., transistors and resistors are to be mounted, component mounting position indicating means provided at a position which appears to lie one upon another with the position of the printed base through the half mirror for sequentially and changeably indicating component mounting positions, and means provided at least on either one of a supporting mount on which the printed base is to be mounted and the component mounting position indicating means for positioning the printed base and the component mounting position indicating means to optically conform with each other.

The above and other objects, features and advantages of the present invention will become readily apparent from considering the following detailed description in conjunction with the accompanying drawings, in which:

FIG. 5 is a perspective view showing the construction of principal parts of another embodiment of the invention;

FIG. 6 is a sectional view of FIG. 5; and

FIGS. 7, 8 and 9 are schematic diagrams showing the construction of principal parts of still other embodiments of the invention.

The present invention will now be described in greater detail with reference to the illustrated embodiments.

Figure 2:
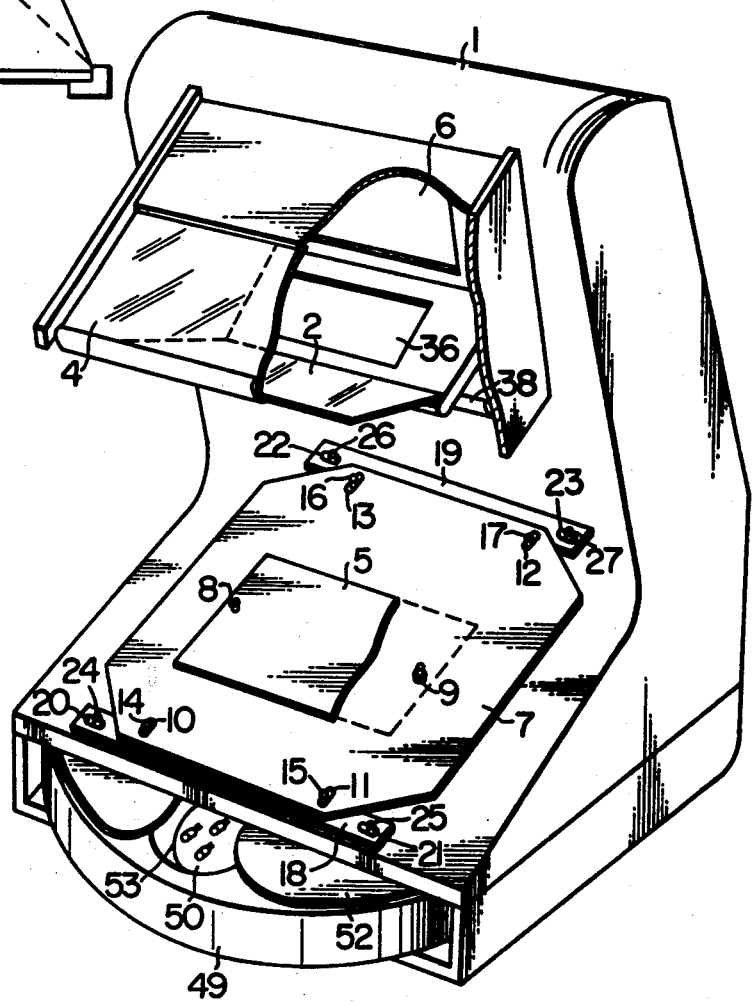
FIG. 2 is a perspective view of an embodiment of the invention.
Figure 3:
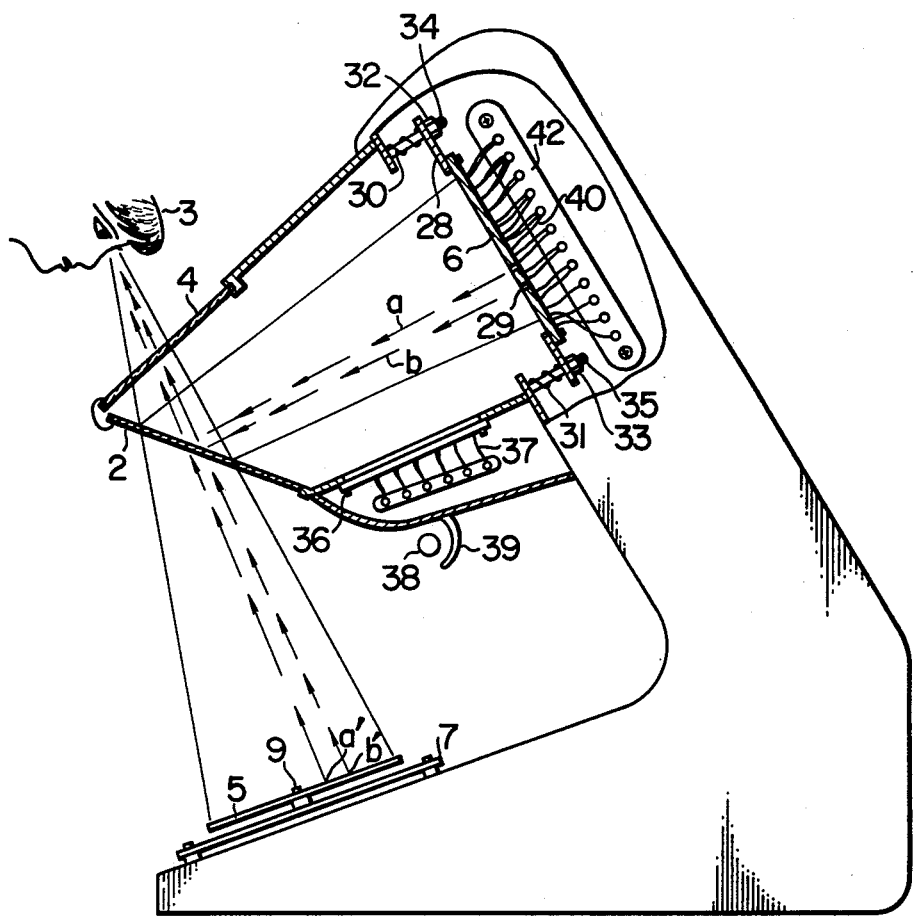
FIG. 3 is a partial sectional view of FIG. 2.
Figure 4:
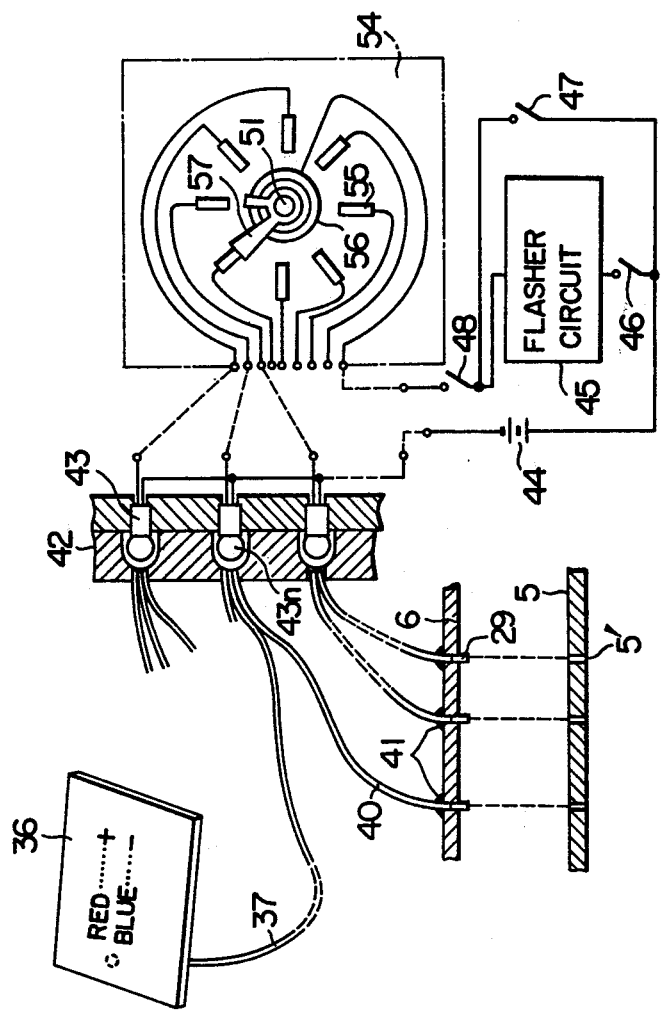
FIG. 4 is an electrical and optical system diagram for the embodiment of FIG. 1.

Referring first to FIGS. 2 through 4, a first embodiment of the invention will be described. In the Figures, numeral 1 designates the apparatus proper including a half mirror 2 mounted in the upper portion thereof, whereby an operator 3 can observe through a transparent plate 4 a printed base 5 on which components such as transistors are to be mounted and a standard base 6 in the form of a double image.

In this embodiment, the printed base 5 is held in place by pins 8 and 9 provided on a supporting plate 7. The supporting plate 7 is provided with slots 10 through 13 so that the supporting plate 7 is movable back and forth in FIG. 2 by means of screws 14 through 17 securely mounted on slide plates 18 and 19. The slide plates 18 and 19 are also provided with slots 20 through 23 so that the slide plates 18 and 19 are movable sidewise in FIG. 2 by means of screws 24 through 27 mounted on the apparatus proper 1. Consequently, the printed base 5 is movable back and forth and sidewise by adjusting the screws 14 through 17 and the screws 24 through 27, respectively.

On the other hand, the standard base 6 is mounted on a supporting frame 28 and is provided with holes 29 at preselected positions. The supporting frame 28 is normally urged by springs 30 and 31 in a direction which moves it away from the half mirror 2 and the supporting position of the supporting frame 28 is adjustable by means of nuts 32 and 33 associated with screws 34 and 35, respectively.

While the supporting frame 28 is shown secured by means of the upper and lower screws 34 and 35, the supporting frame 28 is in fact secured to the apparatus proper 1 at the four corners thereof. It is also possible to eliminate the supporting position of the standard base 6 and arrange so that the printed base 5 is movable toward and away from the half mirror 2 through its supporting pins 8 and 9. In other words, this means and another means comprising the screws 14 through 17 and 24 through 27 are provided to optically conform the printed base 5 and the standard base 6 with each other through the half mirror 2 when the bases 5 and 6 are viewed from the position of the operator 3. Numeral 36 designates a guide plate provided at a position on the apparatus proper 1 which can be seen from above the transparent plate 4 and the guide plate 36 is for example printed with such descriptions as "red-----+, blue------" or the numbers of compartments of a component tray 49 that will be described later and this printed portion is illuminated by the light applied through a light conductor 37 made of a flexible material such as glass or resin. Numeral 38 designates illumination lamps for illuminating the printed base 5, 39 a cover for the lamps 38, 40 light conductors having one ends thereof inserted into the holes 29 in the standard base 6 and secured by adhesives 41, 42 a lamp holder in which are mounted light sources 43 such as lamps or light emitting diodes and to which are secured the other ends of the light conductors 37 and 40, 44 a power source, 45 a flasher circuit, 46 and 47 selector switches which are operatively associated with each other so that when one of the switches is turned on the other switch is turned off. Numeral 48 designates a power switch, 49 a component tray provided with a plurality of component compartments 50 and rotatably mounted on a supporting shaft 51, 52 a cover plate covering the upper surface of the component tray 49 and provided in a portion thereof with an opening 53 which permits the access of the operator's hand to only a selected one of the component compartments 50. Numeral 54 designates a rotary switch including as many stationary contacts 55 as there are the component compartments 50 in the component tray 49, a common contact 56 and a short bar 57 for establishing a short-circuit between the common contact 56 and any selected one of the stationary contacts 55.

With the construction described above, the apparatus according to the first embodiment is used in the following manner. Firstly, where the number of component compartments 50 in the component tray 49 is 8, the number of stationary contacts 55 of the rotary switch 54 is 8 and the number of light sources 43 each comprising a lamp or the like is also 8. The standard base 6 needs not be of any specially designed kind and it may consists of a printed base of the same type as the printed base 5 on which components are to be mounted. In other words, as shown in FIG. 4, one end of the light conductors 40 may be inserted and held firmly in the holes 29 of the standard base 6 corresponding to the associated holes 5' in the printed base 5. In this case, if the component has a single pin, only a single light conductor 40 is required, whereas where the component has a pair of pins it is necessary to use a pair of the light conductors 40 whose one ends are in turn inserted and firmly held in the corresponding holes in the standard base 6. Consequently, where the components has N pins, it is necessary to provide N light conductors 40 whose one ends are secured to the same light source position and firmly hold the other ends of the conductors 40 in the corresponding holes of the standard base 6. In this case, there is no need to give any special attention when the components being mounted are resistors which have no effect on the polarity. However, in the case of components such as diodes and transistors, each pin has its peculiar characteristics and therefore one end or the whole of the associated light conductor is painted with a corresponding color so that these pins can be seen from above the transparent plate 4 in different shapes as shown for example by the arrows $a$ and $b$ in FIG. 3. On the other hand, where the guide plate 36 formed as shown in FIG. 4 is used, the guide plate 36 is partially illuminated through the light conductor 37 to give the indication "red-----+, blue------" only when a light source 43$n$ is energized.

In this case, it is possible to synchronize the component compartments 50 with the stationary contacts 55, the stationary contacts 55 with the light sources 43 and the light sources 43 with the illuminating system of the standard base 6 and the guide plate 36. In operation, when the switches 47 and 48 have been closed with each component compartment 50 containing the corresponding components and at the same time the nuts 32 and 33 and the screws 14 through 17 and 24 through 27 have been adjusted thus optically conforming the standard base 6 and the printed base 5 with each other, the short bar 57 of the rotary switch 54 selects and turns on the light source 43 corresponding to the component compartment 50 exposed through the opening 53 of the cover plate 52 and in this way it is possible to confirm through the transparent plate 4 the indication on the guide plate 36. At the same time, the corresponding holes in the standard base 6 are illuminated through the light conductors 40. In this case, if the standard base 6 is illuminated as shown by the arrows $a$ and $b$ in FIG. 3, the operator 3 can align the line of vision of his eye with the light rays indicating the component mounting positions in the printed base 6 through the half mirror 2. Consequently, the operator 3 can take out the components from the component compartment 50 and mount then in the indicated positions on the printed base 5 in accordance with the indication on the guide plate 36.

When the component tray 49 is rotated so that another component compartment 50 is exposed at the opening 53, the positions in the standard base 6 corresponding to the exposed component compartment 50 are illuminated. When this occurs, in a manner similar to that mentioned previously, the operator 3 can align the line of vision of his eye with the light rays indicating the component mounting positions through the half mirror 2 and at the same time the matters to be attended to can be indicated on the guide plate 36.

While, in the embodiment described above, the switches 47 and 48 are closed, the switch 46 may be closed in place of the switch 47 so that the flasher circuit 45 is connected to the inputs of the light sources 43 causing the latter to flash on and off. Further, as shown in FIG. 3, the lamp holder 42 may be divided into two sections, i.e., one corresponding to the guide plate 36 and the other corresponding to the standard base 6. Still further, instead of providing as many light sources 43 as there are component compartments 50 in the component tray 49, only a single unit of the light source 43 may be provided as shown in FIGS. 5 and 6 so that when the component tray 49 is rotated, the light from the light source 43 is directed to the light conductor 40 corresponding to the component compartment 50 through a small hole 492 formed in a rotating disc 491 which follows the rotation of the component tray 49. The component compartments 50 of the component tray 49 may be designated by the corresponding compartment marks as shown in FIG. 5. The component tray 49 may be of a type which is manually rotated or alternately it may be rotated by means of a motor or the like. On the other hand, the transmission of light to the standard base 6 and the guide plate 36 may be accomplished by providing light sources corresponding to the light sources 43 of FIG. 4 directly on the standard base 6 and the guide plate 36 as shown in FIG. 7. Furthermore, as shown in FIG. 8, the standard base 6 may be replaced with a rear screen 150 so that a light spot may be projected on any given point on the rear screen 150 from a projector 151. Still furthermore, as shown in FIG. 9, the standard base 6 may be replaced with a cathode ray tube 152 so that spots are produced on the face of the cathode ray tube 152. In this case, the mounting of components may be easily controlled by using a color picture tube.

When it is desired to replace the standard base 6, in the case of the standard base 6 constructed for example as shown in FIG. 4, part of the lamp holder 42, the light conductors 40 and the standard base 6 must be replaced or alternately the light conductors 40 and the standard base 6 may be unsoldered to resolder the light conductors 40 to a new standard base 6. The guide plate 36 may be replaced in the similar manner as mentioned in connection with the standard base 6. If the component tray 49 is synchronized with the light sources 43 of FIG. 4 or the hole 492 of FIG. 5, the component tray 49 may be provided apart from the apparatus proper 1.

Figure 1:
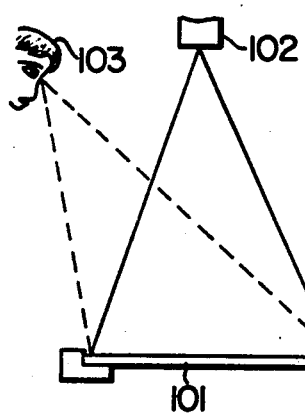
FIG. 1 is a schematic view of a conventional apparatus.

It will thus be seen from the foregoing description of the preferred embodiments of the invention that in accordance with the apparatus of this invention the double image (virtual image) formed by the half mirror 2 is utilized to directly project light spots on the printed base 5 on which components are to be mounted and in this way the deficiencies of the conventional apparatus of FIG. 1 can be overcome with a resulting improved reliability in the mounting of components.

By virtue of the fact that there is no component parts between the half mirror 2 and the standard base 6 or the screen 150 so that the base or screen can be seen directly through the half mirror 2, resulting apparatus is simple in construction. Moreover, the indication of any matters to be attended to or noted, etc., may be simultaneously made on the guide plate 36. Where the light conductors are used, a printed base of the same type as the printed base 5 on which components are to be mounted may be used as the standard base 6 without any modifications.

What we claim is:

1. Apparatus for indicating the positions on a printed base at which components such as transistors and resistors are to be mounted, comprising:
   a half mirror spaced from said printed base,
   component mounting position indicating means comprising a base containing a plurality of apertures at positions therein corresponding to positions on said printed base at which said components are to be mounted, said component mounting position indicating means being located adjacent said half mirror, said half mirror being positioned such that an operator, when viewing said half mirror, sees therein said printed base and superimposed thereon said component mounting position indicating means,
   a light source means,
   a plurality of light conductors mounted one each in said apertures,
   means for adjusting the relative positions of said printed base and said component mounting position indicating means with respect to each other so that said printed base and said component mounting position indicating means optically conform with each other when viewed through said half mirror,
   a plurality of component compartments,
   means for exposing a selected one of said compartments at a time to provide access thereto,
   means for selectively controlling the illumination of said light conductors by said light source means to thereby illuminate the position on said component mounting position indicating means corresponding to the position on said printed base where a selected component is to be mounted, said means for selectively controlling being coupled to and in interlocking relation with said means for exposing to provide access to the compartment holding said selected component, and
   a guide plate located adjacent said component mounting position indicating means containing other light conductors mounted therein, said other light conductors being selectively illuminated by said light source means in accordance with said means for selectively controlling, said guide plate providing instructions for mounting said selected component and being visible simultaneously with said superimposed image of said printed base and component mounting position indicating means.

2. Apparatus according to claim 1 wherein said printed base and said base of said component mounting position indicating means are substantially identical, whereby a printed base when fitted with light conductors in its apertures functions as said component mounting position indicating means.

3. Apparatus according to claim 1 wherein said light source means contains a lamp and said means for selectively controlling comprises an optical switch coupled to said means for exposing which functions to direct light from said lamp to selected ones of said light conductors.

4. Apparatus for indicating the positions on a printed base at which components such as transistors and resistors are to be mounted, comprising:
   a half mirror spaced from said printed base,
   component mounting position indicating means comprising a base containing a plurality of apertures at positions therein corresponding to positions on said printed base at which said components are to be mounted, said component mounting position indicating means being located adjacent said half mirror, said half mirror being positioned such that an operator, when viewing said half mirror, sees therein said printed base and superimposed thereon said component mounting position indicating means,
   a plurality of lamps,
   a plurality of light conductors mounted one each in said apertures,
   means for adjusting the relative positions of said printed base and said component mounting position indicating means with respect to each other so that said printed base and said component mounting position indicating means optically conform with each other when viewed through said half mirror,
   a plurality of component compartments,
   means for exposing a selected one of said compartments at a time to provide access thereto, and
   means for selectively controlling the illumination of said light conductors by said lamps to thereby illuminate the position on said component mounting position indicating means corresponding to the position on said printed base where a selected component is to be mounted, said means for selectively controlling being coupled to and in interlocking relation with said means for exposing to provide access to the compartment holding said selected component, said means for selectively controlling comprising an electrical switch coupled to said means for exposing which functions to selectively energize said lamps to thereby selectively energize said light conductors.

* * * * *